(12) United States Patent
Lee et al.

(10) Patent No.: US 9,988,741 B2
(45) Date of Patent: Jun. 5, 2018

(54) HEAT TREATMENT METHOD AND HEAT TREATMENT DEVICE FOR SINGLE CRYSTAL SAPPHIRE

(71) Applicant: SAPPHIRE TECHNOLOGY CO., LTD., Hwaseong-si (KR)

(72) Inventors: Hee Choon Lee, Seoul (KR); Yi Sik Choi, Gwacheon-si (KR); Sung Hwan Moon, Suwon-si (KR); Gye Won Jang, Seoul (KR); Bok Kee Na, Hwaseong-si (KR)

(73) Assignee: SAPPHIRE TECHNOLOGY CO., LTD., Hwaseong-si (KR)

( * ) Notice: Subject to any disclaimer, the term of this patent is extended or adjusted under 35 U.S.C. 154(b) by 420 days.

(21) Appl. No.: 14/437,928

(22) PCT Filed: Sep. 10, 2013

(86) PCT No.: PCT/KR2013/008154
§ 371 (c)(1),
(2) Date: Apr. 23, 2015

(87) PCT Pub. No.: WO2014/069784
PCT Pub. Date: May 8, 2014

(65) Prior Publication Data
US 2015/0267321 A1    Sep. 24, 2015

(30) Foreign Application Priority Data

Oct. 31, 2012    (KR) .................. 10-2012-0122353

(51) Int. Cl.
*C30B 29/20*    (2006.01)
*C30B 33/02*    (2006.01)

(52) U.S. Cl.
CPC .............. *C30B 33/02* (2013.01); *C30B 29/20* (2013.01)

(58) Field of Classification Search
CPC ................................ C30B 29/20; C30B 33/02
See application file for complete search history.

(56) References Cited

U.S. PATENT DOCUMENTS

| | | | |
|---|---|---|---|
| 6,614,005 B1 | 9/2003 | Walk et al. | |
| 2011/0017124 A1* | 1/2011 | Hoshikawa | ........... C30B 11/002 117/3 |
| 2012/0015799 A1* | 1/2012 | Shonai | .................... C30B 15/00 501/86 |

FOREIGN PATENT DOCUMENTS

CN    102634850 A  *  8/2012
JP    2007161565        6/2007
(Continued)

OTHER PUBLICATIONS

International Search Report—PCT/KR2013/008154 dated Dec. 16, 2013.

*Primary Examiner* — Hua Qi
(74) *Attorney, Agent, or Firm* — Cantor Colburn LLP (57) ABSTRACT

Provided is a sapphire single crystal heat treatment method comprising the steps of: charging a sapphire single crystal into a chamber; raising the temperature in the chamber to a target temperature by heating the chamber; holding the temperature in the chamber at a constant temperature; and cooling the inside of the chamber to room temperature, wherein the temperature raising step comprises: a first temperature raising step of raising the temperature to a first set temperature at a temperature raising rate of 4° C./min to 5° C./min; and a second temperature raising step of raising the temperature to a second set temperature at a temperature raising rate of 1° C./min or less after the first temperature raising step has been completed. The temperature raising process is executed in a multi-stage, to reduce the temperature raising time and prevent a sapphire single crystal from being affected by heat.

3 Claims, 5 Drawing Sheets

(56) References Cited

FOREIGN PATENT DOCUMENTS

| | | | |
|---|---|---|---|
| JP | 2011011950 | 1/2011 | |
| KR | 1019990063170 | 7/1999 | |
| KR | 1020010112501 | 12/2001 | |
| KR | 20080098076 A | * 11/2008 | ............. C03B 19/12 |
| KR | 1020080098076 | 11/2008 | |
| KR | 1020110009622 | 1/2011 | |

* cited by examiner

HEAT TREATMENT METHOD AND HEAT TREATMENT DEVICE FOR SINGLE CRYSTAL SAPPHIRE

TECHNICAL FIELD

The present invention relates to a heat treatment method and apparatus of a sapphire single crystal, in which the sapphire single crystal is heat-treated to thus remove residual stress in the sapphire single crystal, to accordingly suppress occurrence of micro-cracks, and to thereby improve quality of the sapphire single crystal.

BACKGROUND ART

A sapphire single crystal is a material solidified in a direction with a crystal structure of a HCP (Hexagonal Close Packed) structure hexagonal system in the course of solidification after melting alumina ($Al_2O_3$) that is a compound of a combined form of aluminum (Al) and oxygen (O), at a predetermined temperature.

The sapphire single crystal is a material with a hardness next to diamond, has wear resistance and corrosion resistance about 10 times higher than quartz, and has excellent insulating and light transmission properties, which is widely used in the field of advanced materials such as IT, industrial, or military purpose, or substrates for LED, as well as for synthetic gemstones, and glass for watches. In particular, the sapphire single crystal has the spotlight as a material for a touch screen of IT equipment, and has been used as a material for windows for military infrared detection missiles, fighter aircraft, or explorer equipment.

In order to use a sapphire single crystal as windows of a precision instrument, a synthetic sapphire single crystal ingot should go through cutting, grinding and polishing processes to the shape and size of a final product. Such cutting, grinding and polishing processes, diamond abrasive whose hardness is higher than the hardness of a typical sapphire single crystal is used.

First, a cutting process is a step of cutting a synthesized sapphire single crystal ingot into a basic shape and size of a product, in which micro-cracks may occur in the thickness direction from the surface of the product due to friction between the sapphire single crystal and the abrasive during cutting. In addition, a processing stress generated during the cutting process may remain in the interior of the sapphire single crystal and thus the product may have a rough surface.

Then, the grinding process is a step of grinding a roughened surface of the sapphire single crystal more finely after cutting, in which the micro-cracks generated in the thickness direction from the surface of the product during cutting are mostly removed, but the micro-cracks generated during cutting may not be only completely removed, but also other micro-cracks that are smaller than the micro-cracks generated during cutting and a processing stress may remain in the interior of the sapphire single crystal during grinding.

Finally, the polishing process is a step of polishing the surface of the product for a light-transmitting window, in which the micro-cracks that could not be completely removed after grinding are removed in the polishing process, but the micro-cracks and the processing stress may still remain in the surface of the product even in the polishing process.

As described above, in order to use a sapphire single crystal as a window, etc., the above-described processes should be undergone, and thus the intensity of products for the sapphire single crystal windows are significantly reduced due to the micro-cracks and residual stress generated in the processes. In particular, the micro-cracks act as a starting point of fracture when a force is applied on the outside of the window and thus act as the most likely cause to lower the strength of the entire sapphire products.

A residual internal stress also acts as a cause to lower the overall strength of the product. The sapphire single crystal window whose intensity is reduced may be broken more easily when the sapphire single crystal window is used for IT equipment or military use, and may be followed by restrictions at the time of using the sapphire single crystal window as a sensor protection window or a window purpose.

As disclosed in Korean Patent No. 10-0578162 (May 2, 2006), a conventional heat treatment method for a silicon single crystal wafer is configured to include cutting a silicon single crystal ingot thinly to obtain a wafer; and annealing the obtained wafer at temperature of 1200° C. or higher for one second or more by using a rapid heating/rapid cooling apparatus, in which the silicon single crystal ingot is manufactured by increasing a growth speed to 0.6 mm/min or more, an oxygen concentration is below 16 ppma or less, and a COP whose size is 60 nm to 130 nm is present at a high density.

The conventional heat treatment method of the silicon single crystal wafer has the following defects. The silicon single crystal wafer is heated at a constant rate of temperature rise when performing the heat treatment. Accordingly, when the rate of temperature rise is large, the wafer may run a risk of damage such as a crack under the influence of heat, and when the rate of temperature rise is small, the time of temperature rise gets longer, to thereby cause productivity to drop.

DISCLOSURE

Technical Problem

To solve the above problems or defects, it is an object of the present invention to provide a heat treatment method and apparatus for a sapphire single crystal, in which a temperature rise process is executed in a multi-stage whose temperature rise rate differs from each other when raising temperature inside the chamber, thereby reducing the temperature rise time, and minimizing the influence of heat of the sapphire single crystal.

The objects of the present invention are not limited to the above-described objects, and other objects and advantages of the present invention can be appreciated by the following description and will be understood more clearly by embodiments of the present invention.

Technical Solution

To accomplish the above and other objects of the present invention, according to an aspect of the present invention, there is provided a sapphire single crystal heat treatment method comprising the steps of: charging a sapphire single crystal into a chamber; raising the temperature in the chamber to a target temperature by heating the chamber; holding the temperature in the chamber at a constant temperature; and cooling the inside of the chamber to room temperature, wherein the temperature raising step comprises: a first temperature raising step of raising the temperature to a first set temperature at a temperature raising rate of 4° C./min to 5° C./min; and a second temperature raising step of raising the temperature to a second set temperature at a temperature raising rate of 1° C./min or less after the first temperature raising step has been completed.

According to another aspect of the present invention, there is provided a sapphire single crystal heat treatment apparatus comprising: a chamber in which a sapphire single crystal is accommodated; a refractory material attached to the inner wall surface of the chamber, for heat insulating the interior of the chamber; a heating element provided within the chamber, for heating the sapphire single crystal; and a shield member arranged to surround the sapphire single crystal, for preventing the heat of the heating element from being directly delivered to the sapphire single crystal, wherein the chamber employs a dual-chamber having a passage through which a refrigerant flows to prevent deform due to the heat.

Advantageous Effects

As described above, a sapphire single crystal heat treatment method and apparatus according to the present invention includes a temperature raising step including a first temperature raising step of speeding up a temperature raising speed to a certain temperature, and a second temperature raising step of slowing down the temperature raising speed to a target set point temperature after the first temperature raising step has been completed, to thereby reduce the temperature raising time and preventing a sapphire single crystal from being affected by heat.

BEST MODE

Hereinafter, embodiments of the present invention will be described in detail with reference to the accompanying drawings. In the process, the size and shape of the components illustrated in the drawings may be shown exaggerated for convenience and clarity of explanation. Further, by considering the configuration and operation of the present invention the specifically defined terms can be changed according to user's or operator's intention, or the custom. Definitions of these terms herein need to be made based on the contents across the whole application.

Figure 1:
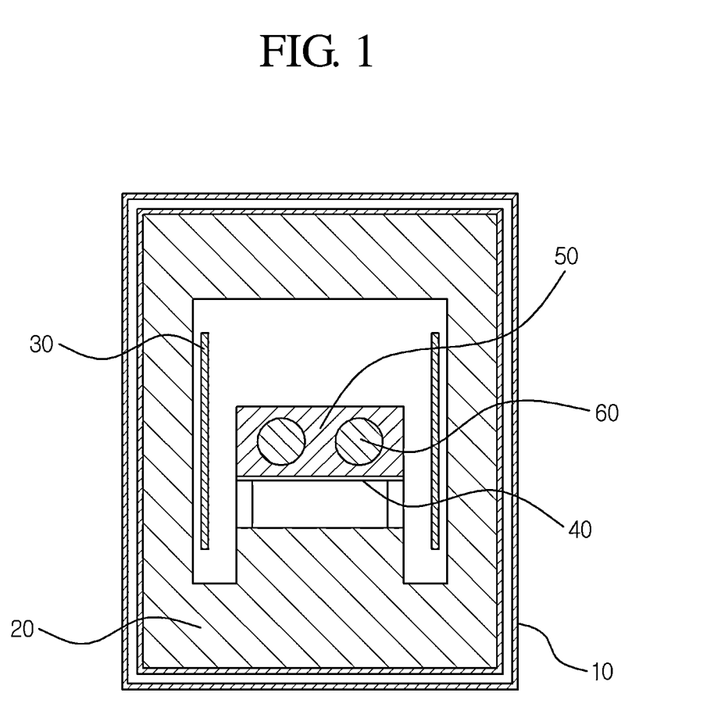
FIG. 1 is a cross-sectional view of a sapphire single crystal heat treatment apparatus according to an embodiment of the present invention.

FIG. 1 is a cross-sectional view of a sapphire single crystal heat treatment apparatus according to an embodiment of the present invention.

Referring to FIG. 1, a sapphire single crystal heat treatment apparatus according to the embodiment includes: a chamber 10 in which a sapphire single crystal 60 is accommodated; a refractory material 20 attached to the inner wall surface of the chamber 10, for heat insulating the interior of the chamber 10; a heating element 30 provided within the chamber 10, for heating the sapphire single crystal 60; and a shield member 50 arranged to surround the sapphire single crystal 60, for preventing the heat of the heating element 30 from being directly delivered to the sapphire single crystal 60, to thus protect the sapphire single crystal 60.

The heat treatment apparatus may be configured to enable a temperature raising process and maintaining the raised temperature at an ultra-high temperature, so that a sapphire single crystal can be thermally treated even at a melting point (2,050° C.) or less in order to maximize the effect of improving the strength of the sapphire single crystal 60.

The chamber 10 is not to be transformed due to the heat emitted from the refractory material 20 at a high temperature of the melting point of the sapphire single crystal 60 of 2,050° C. or less, and is to be compatible with vacuum and gas atmosphere.

Thus, the chamber 10 can employ a dual-chamber having a passage 12 through which a refrigerant flows to cool the chamber 10 using the refrigerant (water, gas, etc.) in order to prevent deformation due to heat.

The internal atmosphere of the chamber 10 may be used with a vacuum atmosphere or a gas atmosphere. Here, in the case of the vacuum atmosphere, the vacuum atmosphere is held for less than one atmosphere, while in the case of the gas atmosphere, the gas atmosphere can be used even at one atmosphere, at one atmosphere or more, or at one atmosphere or less. Argon, hydrogen, helium, nitrogen or the like may be used as gas.

The refractory material 20 plays a role of an insulation material that serves to prevent heat from the heating element 30 from being leaked to the outside. Metallic or ceramic-based materials such as tungsten, molybdenum, carbon, and graphite felt can be used as the material of the refractory material 20.

The heating element 30 serves to heat up the internal the temperature of the chamber 10 up to the melting point or less of the sapphire single crystal 60. Here, an induction heating or resistance heating method may be used as a heating method. In particular, metallic or non-metallic materials, such as tungsten and molybdenum, graphite, and silicon carbide may be used as the materials for the heating element in the resistance heating method.

The shield member 50 prevents the heat emitted from the heating element 30 from being directly delivered to the sapphire single crystal 60, to thus avoid imbalance the temperature of the sapphire single crystal 60 due to the deviation of heat generation of the heating element 30 and to make it possible to undergo a uniform heat treatment.

The shield member 50 may employ a metal material such as tungsten, molybdenum, iridium, or tantalum. Then, a table 40 is provided inside the chamber 10 in which the shield member 50 to wrap the sapphire single crystal 60 is placed on the table 40.

Thus, the heat treatment method of using the sapphire single crystal heat treatment apparatus according to an embodiment of the present invention will be described as follows.

Figure 2:
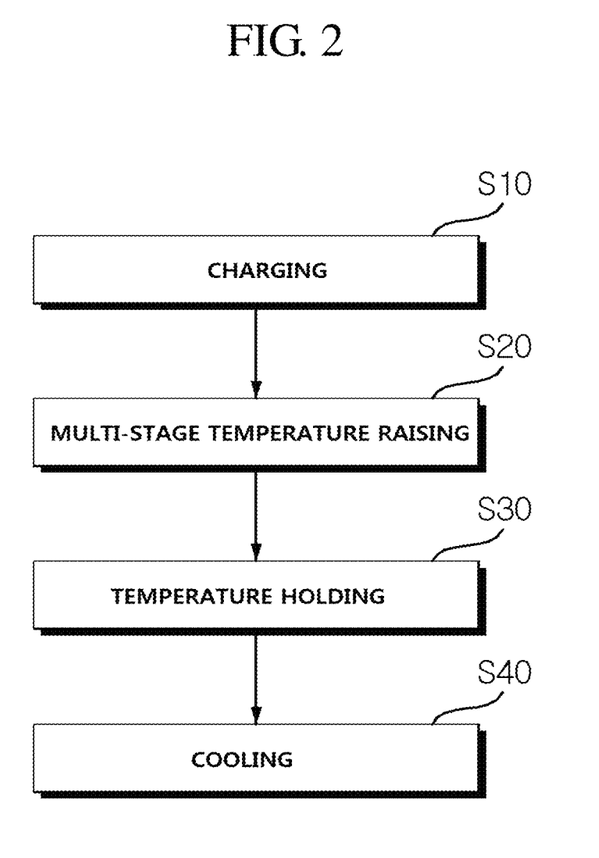
FIG. 2 is a flowchart illustrating a sapphire single crystal heat treatment method according to an embodiment of the present invention.

FIG. 2 is a flowchart illustrating a sapphire single crystal heat treatment method according to an embodiment of the present invention.

The heat treatment process of the present invention includes the steps of: charging a sapphire single crystal 60 into a chamber 10 (S10); raising the temperature in the chamber to a target temperature (S20); holding the temperature in the chamber at a constant temperature (S30); and cooling the inside of the chamber to room temperature (S40).

A sapphire single crystal ingot is cut to the shape and size of a final product, and undergoes grinding and polishing processes.

Therefore, the heat treatment of the sapphire single crystal 60 may be performed after the polishing process as well as even after the cutting or polishing process. In addition, the processing surface of the sapphire single crystal can be used in all of the orientations such as A-plane, C-plane, and R-plane according to the crystal orientation.

First, the charging step (S10) is a step to inject the sapphire single crystal 60 within the chamber 10, in which a method of overlapping and inputting the sapphire single crystals and a method of laminating and inputting the sapphire single crystals with a predetermined interval from each other.

The method of overlapping and inputting the sapphire single crystals among the methods of charging the sapphire single crystal 60 may input a large quantity of the sapphire single crystals into the inner space of the chamber 10, but a non-uniform temperature distribution the sapphire single crystal 60 may occur. Accordingly, the appropriate input amount of the sapphire single crystal 60 needs to be calculated compared to the internal size of the chamber 10.

In addition, the method of laminating and inputting the sapphire single crystals with a predetermined interval from each other may input a small quantity of the sapphire single crystals into the inner space of the chamber 10, in comparison to the method of overlapping and inputting the sapphire single crystals, but enables a uniform heat treatment of the sapphire single crystal.

When the process of charging the sapphire single crystal 60 to be heat treated into the inside of the chamber 10 is completed, the chamber 10 is sealed and the interior vacuum of the chamber 10 is maintained into less than one atmosphere by using a vacuum pump.

When the heat treatment is performed in the gas atmosphere, the inside of the chamber 10 is maintained in the vacuum circumstance, and then gas is input to a target pressure. Then, the gas supply stops or the gas is continuously input to the chamber 10 to thus maintain the interior of the chamber 10 at a constant pressure.

The temperature raising step (S20) is a step of raising the internal temperature to the target temperature, in which the temperature raising process is executed up to a temperature range below the melting temperature of the sapphire, typically 1500° C. or more. In the vicinity of the target temperature during raising the temperature, the temperature raising speed is lowered to facilitate temperature control, to thus prevent the temperature from rising above the target temperature.

In this temperature raising step, when the temperature raising rate is made fast, it is possible to shorten the heat treatment time, to thus improve productivity, but, rather, cracks may occur in the rapid temperature raising step, while when the temperature raising rate is slowed down, to prevent a cracking problem, but to lower productivity.

Thus, in this embodiment, the temperature raising step is separated into a multi-stage temperature raising step, to improve the productivity while preventing the occurrence of cracks. That is, the temperature raising step includes: a first temperature raising step of heating the inside of the chamber 10 to a first temperature at a high temperature raising rate, followed by a second temperature raising step of heating the inside of the chamber 10 at a slower temperature raising rate up to the final heat treatment temperature.

The temperature raising step has been divided into two steps according to the present embodiment, but the temperature raising step may be subdivided into two or more steps.

The temperature is raised to 1,700° C. in the first temperature raising step, in which the first temperature raising process is performed for a certain period of time with a temperature raising rate of 4° C./min to 5° C./min. Thus, in the first temperature raising step, the heat treatment time can be shortened because the temperature raising is carried out at high speed, and also since the temperature raising is carried out up to 1,700 V, the heat can be prevented from being influenced upon the sapphire single crystal.

Here, when the temperature raising rate is less than 4° C./min, the temperature raising time becomes long, and therefore productivity of the product drops. However, when the temperature raising rate is in excess of 5° C./min, the temperature raising speed is too large and thus a temperature difference may occur between the upper and lower sides of the sapphire single crystal as well as between the inside and outside of the sapphire single crystal, to thus cause the sapphire single crystal to be damaged in the form of cracks.

The second temperature raising step is carried out to raise the temperature up to a temperature range of 1,700° C. to 1,950° C. Here, when the temperature in the chamber 10 becomes 1,700° C., the temperature raising speed is lowered to prevent overheating of the sapphire single crystal and to perform a temperature raising process up to a set temperature. In the second temperature raising step, the temperature raising process is executed with the temperature raising rate of 1° C./min or less for a certain period of time, to thus raise the temperature in the chamber 10 up to a target temperature, for example, so as to be slowly heated to 1,850° C.

Here, when the temperature raising rate exceeds 1° C./min, the sapphire single crystal may be overheated and possibly exceed a target heat treatment temperature to be maintained.

The temperature holding step (S30) is a step of maintaining the temperature in the chamber 10 at a target temperature for a certain period of time after raising the temperature in the chamber 10 to the target temperature, in which microcracks and a residual stress of the sapphire single crystal are substantially eliminated.

In this case, the holding temperature functions as a very important factor in terms of improving the strength after the heat treatment. The higher the holding temperature may be, intensity after the heat treatment is further improved. However, when keeping the temperature above the 1,950° C., a massive amount of water evaporates, and thus the sapphire single crystal becomes smaller in size than the size of the sapphire single crystal before the heat treatment, to accordingly cause the sapphire single crystal to be unusable as a product. Meanwhile, when keeping a low temperature of less than 1,700° C., the low strength improving effect and the lengthened temperature retention time may act as factors to degrade the productivity. Therefore, it is preferable to perform the heat treatment at a temperature of 1,700° C. to 1,950 V as the temperature to be maintained.

In addition, too a short retention time may cause the heat treatment effect to drop, and too a long holding time may cause the heat treatment effect to become small after a particular retention time in the course of the heat treatment, to thus drop productivity. Therefore, it is preferable to set the retention time to be in a range of 5 to 50 hours.

A cooling step (S40) is a step to lower the temperature to room temperature, to prevent the occurrence of the stress in the sapphire single crystal due to thermal shock during cooling.

Too a fast cooling speed leads to a large temperature difference inside the sapphire single crystal and thus the large temperature difference may cause a thermal stress, rather to thus degrade the strength of the sapphire single crystal and thereby cause cracks to occur in the sapphire single crystal. Then, the cooling speed is too slow, leading to reduced productivity. Accordingly, it is preferable to set the cooling speed of 0.1° C./min to 5° C./min.

It is possible to determine the effect of the heat treatment by performing the intensity measurement of the sapphire single crystal whose heat treatment has been completed. Strength measurements comply with the ASTM International Standards to thereby employ measurements such as three-point, four-point, and ring on ring, and measurements such as a ball drop.

Further, after the heat treatment, the change of the sapphire single crystal was observed through a microscope. After completion of the heat treatment using the present method, micro-cracks and residual stresses that occur during processing a sapphire single crystal are eliminated from the sapphire single crystal, to thereby enable the use of a window whose strength is improved.

Thus, the sapphire single crystal heat treatment method according to the present embodiment can be carried out by separating the temperature raising step in a multi-stage so that the temperature raising speed varies in each stage of the multi-stage, to thereby shortening the temperature raising time while suppressing the influence due to the heat of the sapphire single crystal.

EXAMPLE

A resistance heating system was used as a heating method employed in a heat treatment furnace for the heat treatment of a sapphire single crystal in which graphite was used as a heating element and graphite-based felt was used as a refractory material. Also, a molybdenum shield was used between the sapphire single crystal to be heat treated and the heating element to perform a uniform heat treatment.

The chamber in the heat treatment furnace is located on the outermost outside, and the refractory materials, heaters, shields, and the sapphire single crystals are positioned to the inside direction in sequence. Also, the sapphire single crystal to heat treated is a wafer of a diameter of 2-inch, the crystal plane orientation is a C-plane, the thickness thereof is 0.4 mm, and both the surfaces thereof were ground at the surface roughness of 0.001 μm (Ra) or less that is a sapphire wafer processing level for LEDs. The charging was subjected to in the inside of the shield in the heat treatment furnace, by overlapping the single crystal wafers with each other. After sealing the chamber, air was evacuated to the degree of vacuum of less than $10 \times 10^{-2}$ torr using a vacuum pump, and then the temperature raising was carried out.

The temperature raising process is divided in two steps, in which the chamber was heated to a first temperature at a quick temperature raising speed in a first step, and was heated to a final heat treatment temperature at a slow temperature raising speed in a second step. In other words, the temperature raising process was carried out for 7 hours with a temperature raising rate of about 4° C./min up to 1,700, and carried out for 2 hours with a temperature raising rate of about 1° C./min up to 1,700 V to 1,850° C.

When reaching the retention temperature, the temperature was not raised up to 1,850° C. or higher. The temperature raising step may be further subdivided in accordance with the heating performance and the retention temperature in the heat treatment furnace. The holding was carried out for 30 hours at 1,850° C., and the cooling was carried out for 9 hours with a cooling rate of about 3.3° C./min to room temperature, to thereby minimize a thermal stress that may occur during the cooling.

In order to determine the intensity change after the heat treatment, a sapphire wafer subjected to the heat treatment and a sapphire wafer not subjected to the heat treatment underwent a ring on ring compression strength test in accordance with ASTM standards.

Figure 3:
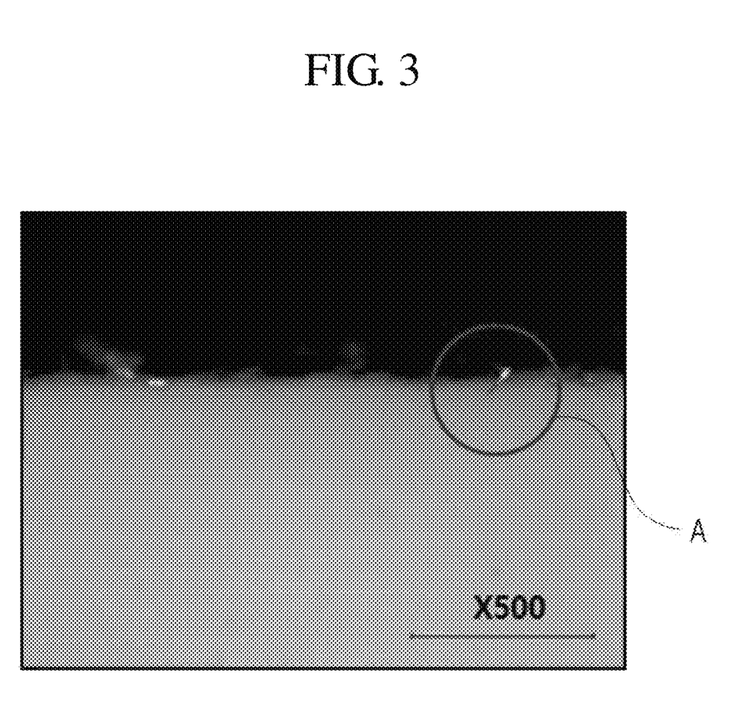
FIG. 3 is a photo showing the fracture strength and fracture aspect of the sapphire single crystal before the heat treatment and after the heat treatment.

As the measurement results, as shown in FIG. 3, the fracture strength of the wafer not subjected to the heat treatment was measured in 3 GPa, the fracture strength of the heat treated wafer was subjected to improve six-times the strength after the heat treatment to 18 GPa.

Heat treatment effects showed differences even in the shape of broken wafers after the ring on ring compressive strength test. That is, it was confirmed that the size of the fracture pieces of the wafer subjected to the heat treatment is less than the size of the fracture pieces of the wafers not subjected to the heat treatment.

Figure 4:
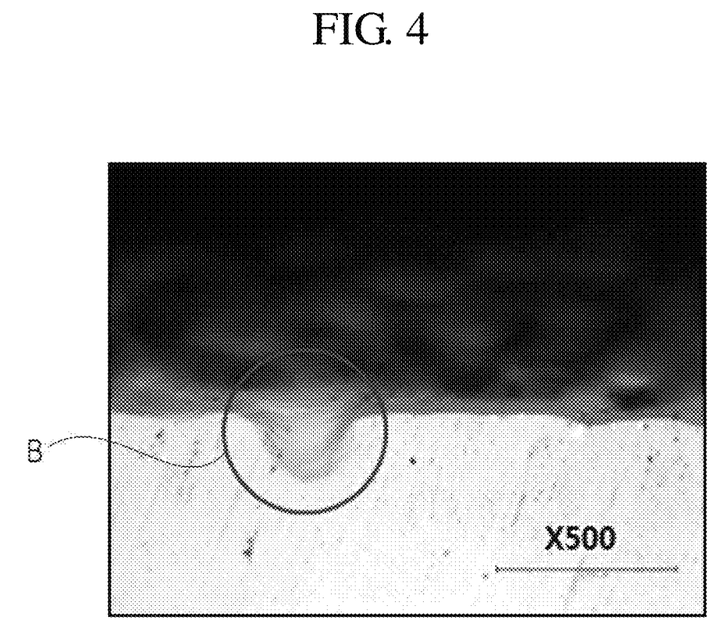
FIG. 4 is a photo showing the micro-cracks in the sapphire single crystal before the heat treatment.
Figure 5:
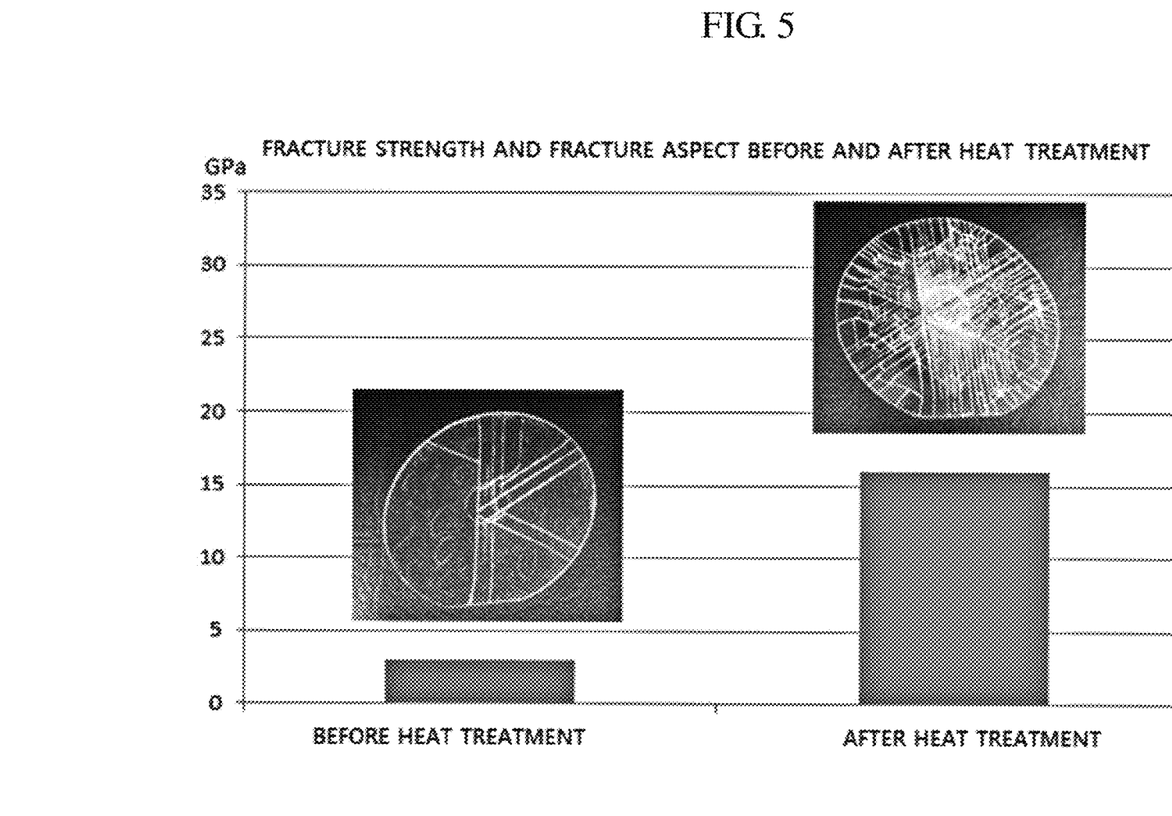
FIG. 5 is a photo showing the micro-cracks in the sapphire single crystal after the heat treatment.

In addition, as shown in FIGS. 4 and 5, micro-cracks (A) existing in the sapphire single crystal after the processing step were changed from the sharp portion (A) before the heat treatment to the gentle portion (B) after the heat treatment, to thus prevent breakage starting at the sharp micro-cracks on external impact and to thereby increase the strength.

INDUSTRIAL APPLICABILITY

The present invention is widely used in high-tech material fields such as a substrate for LEDs for IT, industrial, or military purposes, and can be applied for the manufacturing technology of the sapphire single crystal.

As described above, the present invention has been described with respect to particularly preferred embodiments. However, the present invention is not limited to the above embodiments, and it is possible for one of ordinary skill in the art to make various modifications and variations, without departing off the spirit of the present invention. Thus, the protective scope of the present invention is not defined within the detailed description thereof but is defined by the claims to be described later and the technical spirit of the present invention.

The present invention may be applied to a single rotor type motor in which a coil terminal for electrically connecting between stator coils is placed on a bobbin of a stator, to thus make it easy to assemble the motor and solve a coil disconnection problem.

The invention claimed is:

1. A sapphire single crystal heat treatment method consisting of steps of:
   charging a sapphire single crystal into a chamber;
   raising a temperature inside the chamber to a target temperature by heating the chamber, wherein the temperature raising step consists of: a first temperature raising step of raising the temperature to 1,700° C. at a temperature raising rate of 4° C./min to 5° C./min; and a second temperature raising step of raising the temperature from the 1,700° C. to the target temperature being a range of 1,850° C. to 1,950° C. at a temperature raising rate of 1° C./min or less after the first temperature raising step;
   holding the temperature inside the chamber at the target temperature for a predetermined period of time; and
   cooling the temperature inside the chamber from the target temperature to room temperature at a predetermined cooling speed.

2. The sapphire single crystal heat treatment method of claim 1, wherein the predetermined period of time is from 5 to 50 hours.

3. The sapphire single crystal heat treatment method of claim 1, wherein the predetermined cooling speed is 0.1° C./min to 5° C./min.

* * * * *